(12) United States Patent
Rösner et al.

(10) Patent No.: US 8,097,915 B2
(45) Date of Patent: Jan. 17, 2012

(54) SEMICONDUCTOR MEMORY DEVICE

(75) Inventors: Wolfgang Rösner, München (DE);
Franz Hofmann, München (DE);
Michael Specht, München (DE);
Martin Städele, Ottobrunn (DE);
Johannes Luyken, München (DE)

(73) Assignee: Qimonda AG, Munich (DE)

( * ) Notice: Subject to any disclaimer, the term of this patent is extended or adjusted under 35 U.S.C. 154(b) by 272 days.

(21) Appl. No.: 11/139,976

(22) Filed: May 31, 2005

(65) Prior Publication Data

US 2006/0267084 A1 Nov. 30, 2006

(51) Int. Cl.
*H01L 31/119* (2006.01)

(52) U.S. Cl. . 257/330; 257/331; 257/332; 257/E29.201; 257/E29.26

(58) Field of Classification Search .......... 257/330, 257/331, 332, E29.201, E29.26
See application file for complete search history.

(56) References Cited

U.S. PATENT DOCUMENTS

| | | | |
|---|---|---|---|
| 5,034,341 A | 7/1991 | Itoh | |
| 5,075,571 A | 12/1991 | Dhong | |
| 5,327,374 A * | 7/1994 | Krautschneider et al. | .... 365/149 |
| 5,363,325 A | 11/1994 | Sunouchi et al. | |
| 5,684,313 A * | 11/1997 | Kenney | ......... 257/296 |
| 6,111,286 A * | 8/2000 | Chi et al. | ....... 257/315 |
| 6,312,982 B1 * | 11/2001 | Takato et al. | ......... 438/238 |
| 6,762,447 B1 | 7/2004 | Mandelman et al. | |
| 2006/0267064 A1 * | 11/2006 | Rosner et al. | ........ 257/304 |
| 2007/0228489 A1 * | 10/2007 | Nakajima et al. | ............ 257/378 |

OTHER PUBLICATIONS

Office Action dated Oct. 9, 2008 in U.S. Appl. No. 11/139,977.

* cited by examiner

*Primary Examiner* — Samuel Gebremariam
(74) *Attorney, Agent, or Firm* — Eschweiler & Associates, LLC

(57) ABSTRACT

A semiconductor memory device comprises a plurality of memory cells, each memory cell having a respective transistor. The transistor comprises a transistor body of a first conductivity type, a drain area and a source area each having a second conductivity type, wherein said drain area and source area are embedded in the transistor body on a first surface of said transistor body, a gate structure having a gate dielectric layer and a gate electrode. Said gate structure is arranged between said drain area and said source area. An emitter area of said first conductivity type is provided wherein said emitter area is arranged on top of said drain area.

23 Claims, 5 Drawing Sheets

SEMICONDUCTOR MEMORY DEVICE

TECHNICAL FIELD

The present invention relates to a semiconductor memory device.

Although the invention can in principle be applied to any desired semiconductor memory device, the invention and its underlying problem will hereinafter be explained with reference to random access memory devices.

A commonly known random access memory device comprises a plurality of memory cells each provided with one transistor and one capacitor, so-called one-transistor-one-capacitor-cells. A binary information is stored in the memory cell as a charge in the capacitor. A read out of the information is achieved by addressing the transistor via a bit line and a word line. A current flow of the charge from the capacitor through the transistor into the bit line is detected and interpreted via a reading decoder. For a reliable operation of the reading decoder a minimal charge is necessary thus demanding for a minimal capacitance of about 30 fF to 40 fF.

It is demanded to integrate a large amount of memory cells on an acceptably small area. Therefore, the lateral dimensions of the capacitor and the transistors need to be reduced.

The capacitance of a capacitor depends especially on the surface area of the electrodes of the capacitors. At present, the surface of the electrodes and thus the minimal capacitance is maintained by increasing the vertical dimensions or folding the electrodes for compensating the shrinking lateral dimensions. However, at present it is no more feasible to manufacture capacitors with further reduced lateral dimensions.

Further, as a separation of the source and drain area is shrinking along with the reduction of the lateral dimensions, a channel length becomes shorter. The shorter channel leads to higher leakage currents from drain to source. Therefore, the maintenance time of the charge in the capacitor is reduced. Thus, disadvantageously, a higher refresh rate of the charge becomes necessary.

S. Okhonin et. al. describe in IEEE, Electron Device Letters, Vol. 23, No. 2, page 85, February 2002 a memory cell consisting of a transistor. Information is stored as a charge injected into a transistor body of the respective transistor. The injected charge shifts a threshold value of the transistor. Thus a read-out of the information may be obtained by determining the threshold value of the transistor. The maintenance time for the injected charges is in the range of a few milliseconds. Compared to 250 ms of DRAM devices of present state of the art this maintenance time is unacceptably low. A reliable operation of such a memory cell would require a very high refresh rate of the injected charges.

SUMMARY OF THE INVENTION

An object of the present invention is to provide a semiconductor memory device with further reduced lateral dimensions and a sufficient maintenance time of information stored therein.

The above mentioned object is solved by a semiconductor memory device with the features of claim 1.

The semiconductor memory device according to the present invention comprises a plurality of memory cells, each memory cell having a respective transistor. The transistor comprises a transistor body of a first conductivity type, a drain area and a source area each having a second conductivity type, wherein said drain area and source area are embedded in the transistor body on a first surface of the transistor body, a gate structure having a gate dielectric layer and a gate electrode. Said gate structure is arranged between said drain area and said source area. An emitter area of said first conductivity type is provided wherein said emitter area is arranged on top of said drain area.

A basic idea of the present invention is to store information by injecting charges into the transistor body. A read-out is achieved by measuring the threshold value or a related physical property. The injection of the charge may be achieved by an additional transistor formed by the emitter area, the drain area and the transistor body. The injection may be controlled by applying respective voltages to the emitter area and the gate electrode in order to have a small current flowing from the emitter area through the drain area to capacitances of the gate dielectric. In the mean time an amplified current flows from the emitter to the transistor body, according to the principles of bipolar transistors. The current provides a large amount of charges which are injected into the transistor body. Thus, at least a minimal charge remains for a requested maintenance time in the transistor body.

Further improvements and refinements of the inventive semiconductor memory device are given by or can be derived by the dependent claims.

Preferably, the emitter area is embedded within the drain area.

In a particularly preferred refinement a recess is formed in the first surface between said drain area and said source area, wherein the gate dielectric layer and the gate electrode are at least partially arranged in said recess. Thus, the channel extends deeper into the semiconductor body than the source and the drain area. Charges stored at large distance to the source and drain areas are still influencing the threshold value. Additionally, the curved channel is more sensitive to injected charges. Therefore, a smaller amount of charges is sufficient for significant shift of the threshold value. A vertical extension of said recess may be larger than a vertical extension of said drain area and said source area.

In an embodiment an isolation trench is provided adjacent to and surrounding all sidewalls or vertical borders of said transistor body. Preferably a conductive material fills at least partially said isolation trench, wherein a dielectric layer is arranged on sidewalls of said isolation trench for isolating said transistor body from said conductive material.

According to a refinement the conductive material forms a first common electrode for a plurality of memory cells.

According to a refinement, the source line is formed as a spacer in parallel to the gate electrode. As generally known, an isolating spacer is provided to the sidewalls of the gate stack for isolation purposes. Adjacent to this isolation spacer, the source line is formed as a further spacer made of a conductive material. The area consumption of such a source line is very low.

According to a further refinement, the transistor body comprises a first region and a second region. Said second region is arranged near said first surface and said first region is arranged in a bulk area of the transistor body under and adjacent to said second region, wherein a doping concentration of dopants of said first conductivity type is higher in said first region than in said second region. It can be demonstrated that a leakage of the charges increases with increasing gradients at the source/drain junctions with the semiconductor body. By simply reducing the concentration, a gradient and, therefore, the leakage current of the charges is reduced.

According to a further refinement, an underlying semiconductor substrate and an isolation layer is provided, wherein said transistor body is isolated from said underlying semiconductor substrate by said isolation layer. The transistor body may comprise a third region and a vertical border, said third region is arranged adjacent to or near both said semiconductor substrate and said vertical border wherein a doping concentration of a dopant of said first conductivity type is higher in said third region than in a bulk area of the transistor body.

According to a further preferred embodiment, an emitter area of said first conductivity type is embedded in said drain area adjacent to said first surface A bipolar transistor is formed by the emitter area, the drain area and the transistor body. A small current flows from the emitter area through the drain area to the gate dielectric when respective voltages are applied to the emitter area and the gate electrode. According to the principle of a bipolar transistor a larger current may then flow from the emitter area to the transistor body. This current provides a large amount of charges filling the capacitor structures.

According to a refinement at least one bit line, at least one source line and at least one word line are provided. Said gate electrode is connected to said word line, said drain area is connected to said bit line and said source area is connected to said source line common to a plurality of said memory cells.

According to a preferred embodiment, the emitter area is distanced from said gate electrode by said gate dielectric layer defining a MOS-mode of the additional transistor.

Exemplary embodiments of the invention are illustrated in the drawings and explained in more detail in the following description.

BRIEF DESCRIPTION OF THE DRAWINGS

In the FIGS. 1-5, identical reference numerals denote identical or functionally equivalent parts.

DETAILED DESCRIPTION OF A PREFERRED EMBODIMENT

Figure 1:
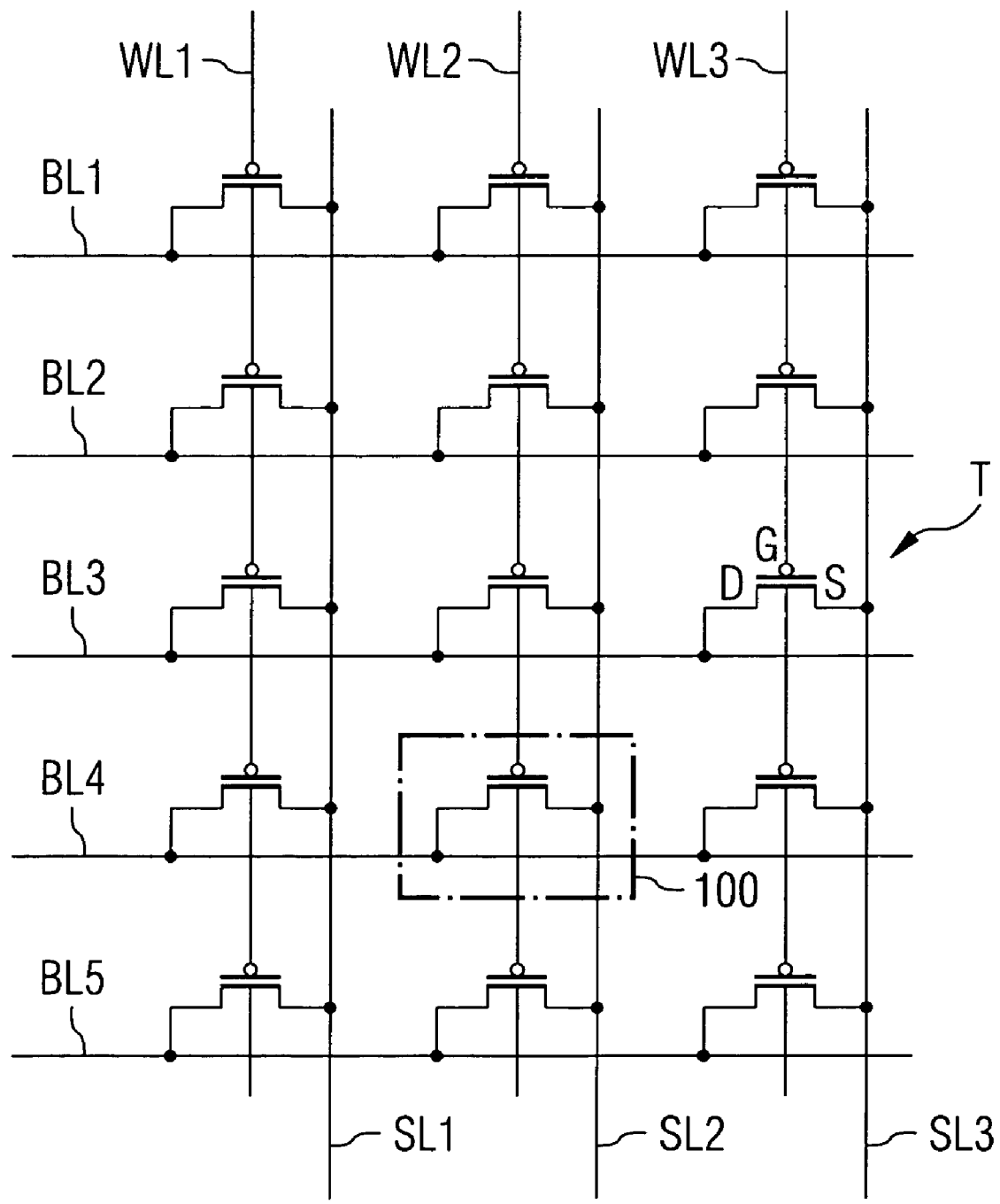
FIG. 1 schematically illustrates a wiring scheme of an embodiment of the present invention.

FIG. 1 illustrates a wiring scheme of most embodiments of the present invention. Each memory cell 100 comprises a transistor T having a gate G connected to a word line WL1, WL2, . . . (WL), a drain D connected to a bit line BL1, BL2, . . . (BL) and a source S connected to a source line SL1, SL2, . . . (SL).

It is common to name drain and source according to the direction of a current flow. However, to keep the description of the present invention simple, the side connected to the bit line will be hereinafter always called drain and the side connected to the source line will be called source. It is understood that the nomination is arbitrary and source and drain may be interchanged.

The memory cells 100 are arranged in a matrix wherein each column is addressed by a respective word line WL, and memory cells 100 along a line of the matrix are addressed by a single bit line BL. Source lines may also connect memory cells 100 columnwise or linewise at their respective source. It should be noted that source S of a memory cell is connected to a common potential shared by a plurality of memory cells and provided by a source line SL. In a RAM device, sources of different memory cells are not interconnected but only connected to its respective capacitor.

Figure 2:
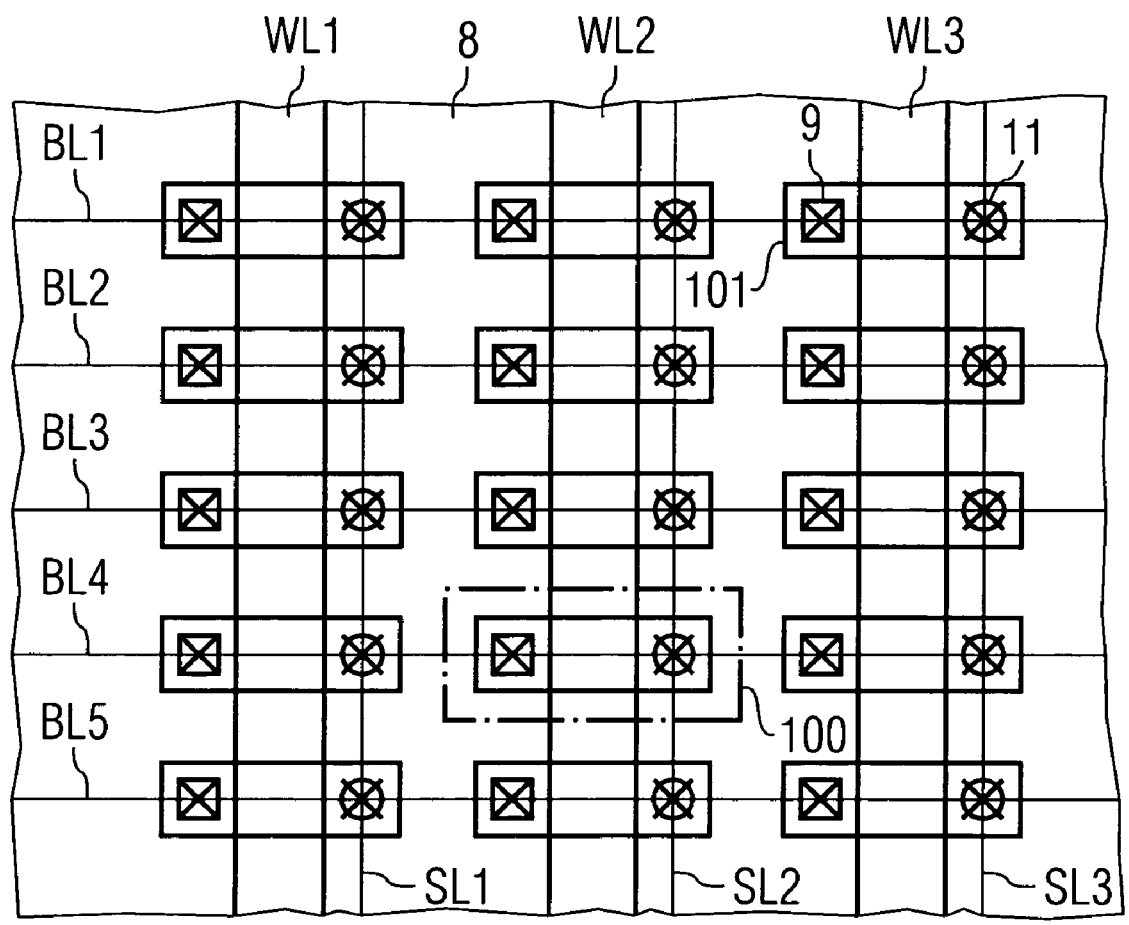
FIG. 2 illustrates a top view of an embodiment of the present invention.

FIG. 2 illustrates a top view of an embodiment of the present semiconductor memory device. A plurality of memory cells are arranged in lines and columns. Each memory cell 100 comprises one transistor 101 having drain connected to bit lines BL via a bit line contact 9 and source connected to source lines SL. The word lines are in contact with gates of the transistors 101. The geometric arrangement of crossing word lines WL and bit lines BL is similar or identical to arrangements according to the present state of art in semiconductor memory devices. The source lines SL may be arranged in parallel to the word lines WL. It is as well possible to arrange the source lines in parallel to the bit lines BL.

Transistors of different memory cells 100 are isolated from each other by isolation trenches 8 provided between the transistors. Advantageously, the isolation trenches 8 are adjacent to at least one side of the active areas of the transistors, preferably to all sides of the active areas, in order to minimize the lateral space consumption of the memory device.

Figure 3:
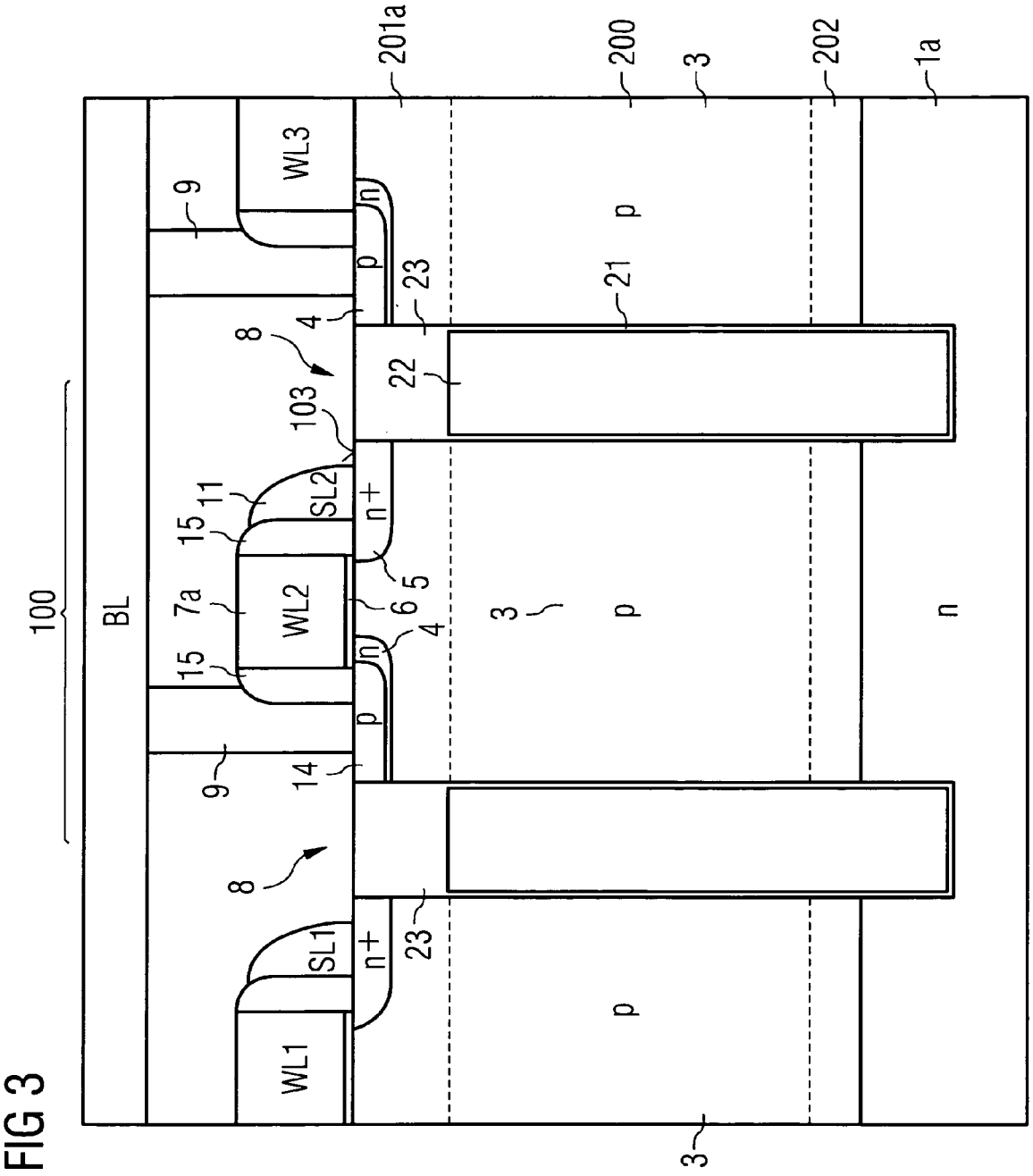
FIG. 3 to 5 illustrate cross-sections of three embodiments of the present invention.

FIG. 3 illustrates a cross-section through a first embodiment of a semiconductor memory device. At a first surface of a transistor body 3, a drain area 4 and a source area 5 are arranged. The transistor body 3 comprises a semiconductor material doped with a dopant of a first conductivity type, for example a p-type. The source and drain areas are doped with a dopant of a second different conductivity type, in the present example with an n-type dopant. On the first surface 103, a gate dielectric layer 6 is at least arranged between the source and the drain area and may extend in one embodiment over the drain area 4. A gate electrode 7a is arranged on top of the gate dielectric layer 6. The gate electrode 7a may be formed by a word line WL or is connected to the word line WL. Thus, a field effect transistor (FET) is provided formed by the drain area 4, a gate structure comprising the gate dielectric layer 6 and the gate electrode 7a, and the source area 5.

The transistor body 3 is arranged on a substrate 1a doped with a dopant of a second conductivity type, in this example an n-type. Thus, a pn-junction isolates the transistor body 3 and the semiconductor substrate 1a. As described hereinabove sidewalls of the transistor body 3 and the active area are surrounded by isolation trenches 8 and thus isolated from neighboring cells 100. In consequence, the transistor body 3 is completely isolated and/or has a floating potential.

In the following, a working principle of a semiconductor memory device and its memory cells as described herein above should be briefly explained. In general information is represented by at least two distinguishable states of a memory cell.

A characteristic of a FET is its threshold value. The threshold value is a voltage defined as a minimal voltage applied to the gate of the FET for switching a channel from a non-conductive state to a conductive state. The threshold voltage depends on charges injected into the transistor body 3. These charges are lowering the threshold voltage by several hundred millivolts. Thus two distinguishable states can be defined as a transistor body 3 having injected charges and a transistor body 3 without injected charges. A read-out of the information may be obtained by measuring the conductivity of the channel when a predetermined voltage is applied to the gate electrode 7a. The predetermined voltage is chosen such that the FET is conductive in one state but not in the second state. An example for such a predetermined voltage is a mean value of the respective threshold voltages of the FET in the first and the second state.

For a full implementation of such a memory device it is necessary to write, to store and to delete the information as well, i.e. to inject charges into the transistor body 3, to maintain charges in the transistor body 3 and to extract these charges out of the transistor body 3.

In the following, features of the embodiment for injecting the charges will be described. An emitter area 14 is embedded in the drain area 4. Alternatively, the emitter area 14 may also be arranged on top of the drain area 4. This emitter area 14 is doped with a dopant of a first conductivity type, in the present example with a p-type. Thus, a bipolar transistor is formed by the emitter area 14, the drain area 4, forming the basis of the bipolar transistor, and the transistor body 3 forming the collector of the bipolar transistor.

A characteristic feature of a bipolar transistor is that when a small current is flowing from the emitter 14 to the base 4, an amplified current may flow from the emitter 14 to the collector 3. Such a small current flows from the emitter 14 to parasitic capacities in the area of the gate dielectric layer 6 when a negative voltage is applied to the gate electrode 7a and a positive voltage to the emitter 14. The difference of these voltages has to be larger than a forward voltage of a pn-junction, e.g. 0.7 V. Parallel to the small current an amplified current, typically amplified by a factor of 100, flows into the collector 3. This amplified current injects the charges. Thus, a controlled and highly efficient mechanism for injecting charges into the transistor body 3, i.e. writing of information, is obtained by implementing the bipolar transistor. Advantageously, the writing operation is very efficient, as in principle the main current flow is for injecting charges.

In order to prevent that charges are injected into transistor bodies of neighboring memory cells 100, a positive voltage may be applied to their respective word lines and/or a negative voltage to their bit lines. Thus at least a voltage difference between the word line to the bit line should be below the forward voltage for the neighboring cells not be programmed.

The information should be stored for a duration of at least several tens of milliseconds, preferably for 250 ms. In consequence, after a writing operation, a minimal amount of charge (minimal charge) has to be maintained for the requested duration. The minimal charge is defined as the charge necessary to form two distinguishable states, that is to say, the minimal charge sufficiently shifts the threshold value such that the shift may be detected.

The maintenance duration may be increased by minimizing the leakage currents of the charges out of the transistor body 3. The pn-junctions of the transistor body 3 formed with the drain area 4, the source area 5 and the substrate 1a are identified as leakage paths for the injected charges. It was recognized that the leakage current increases with the steepness or gradient of the dopants in the area of the pn-junctions. Therefore, an absolute dopant concentration of the dopant within the transistor body 3 is kept low in a second region 201a adjacent to the drain area 4, source area 5 and in a third region 202 adjacent to the semiconductor substrate 1a.

The storage capacitance of the floating and/or isolated transistor body 3 is limited. Its capacitance is mainly formed by the pn-junctions of the transistor body 3 on the one hand and the semiconductor substrate 1a, the drain area 4 and the source area 5 on the other hand. A further contribution to the capacitance is provided by a capacitor formed by the gate stack 6,7 and the transistor body 3. In such a case already a loss of a small amount of charges erases the information irrevocably. Therefore, the capacitance is increased as described herein below.

Isolation trenches 8 are formed adjacent to the transistor body 3. These isolation trenches 8 may be filled with a dielectric material. But in a most preferred refinement a dielectric layer 21 is provided on sidewalls of the isolation trenches 8 and the isolation trenches 8 are at least partially filled with a conductive material 22. Thus, the transistor body 3, the dielectric layer 21, and the conductive material 22 form a capacitor unit. The capacitor unit allows to store a large amount of injected charges in the transistor body 3. Thus, an excess charge over the minimal charge may be stored. Thus, it takes longer until the charge falls below the minimal charge due to leakage currents.

A capacitance of a capacitor increases with a conductivity of its electrodes. In order to achieve this high conductivity of the electrode formed by the transistor body 3, a first region 200 in the bulk or volume of the transistor body 3 is highly doped. The second and third regions are only weakly doped for keeping leakage currents low, as described herein above.

The conductivity material 22 may be only filled into the trenches 8 up to a level below the drain and source areas 4, 5. As pointed out herein before, a low dopant profile must be provided in these areas, thus these upper parts of the trenches 8 would not contribute significantly to the capacitance. Further, a capacitor unit close to the drain and source areas may contribute to a significantly increased leakage current of the injected charges.

An erasing operation is achieved by applying a negative voltage to the source line SL. The injected charges, in the present example holes, are discharged over the pn-junction into the source line SL.

The writing operation may be achieved by the additional bipolar transistor as described herein above. In an other embodiment an additional field effect transistor may be provided for this purpose. This additional FET is formed by the emitter electrode 14, the drain area 4, the transistor body 3 and the gate electrode 7a. In this case, the drain area 4 and the emitter electrode 14 extend below the gate electrode 7a. This second field effect transistor having majority carrier of a first conductivity type may be switched on by applying a respective voltage to the gate electrode 7a.

Figure 4:
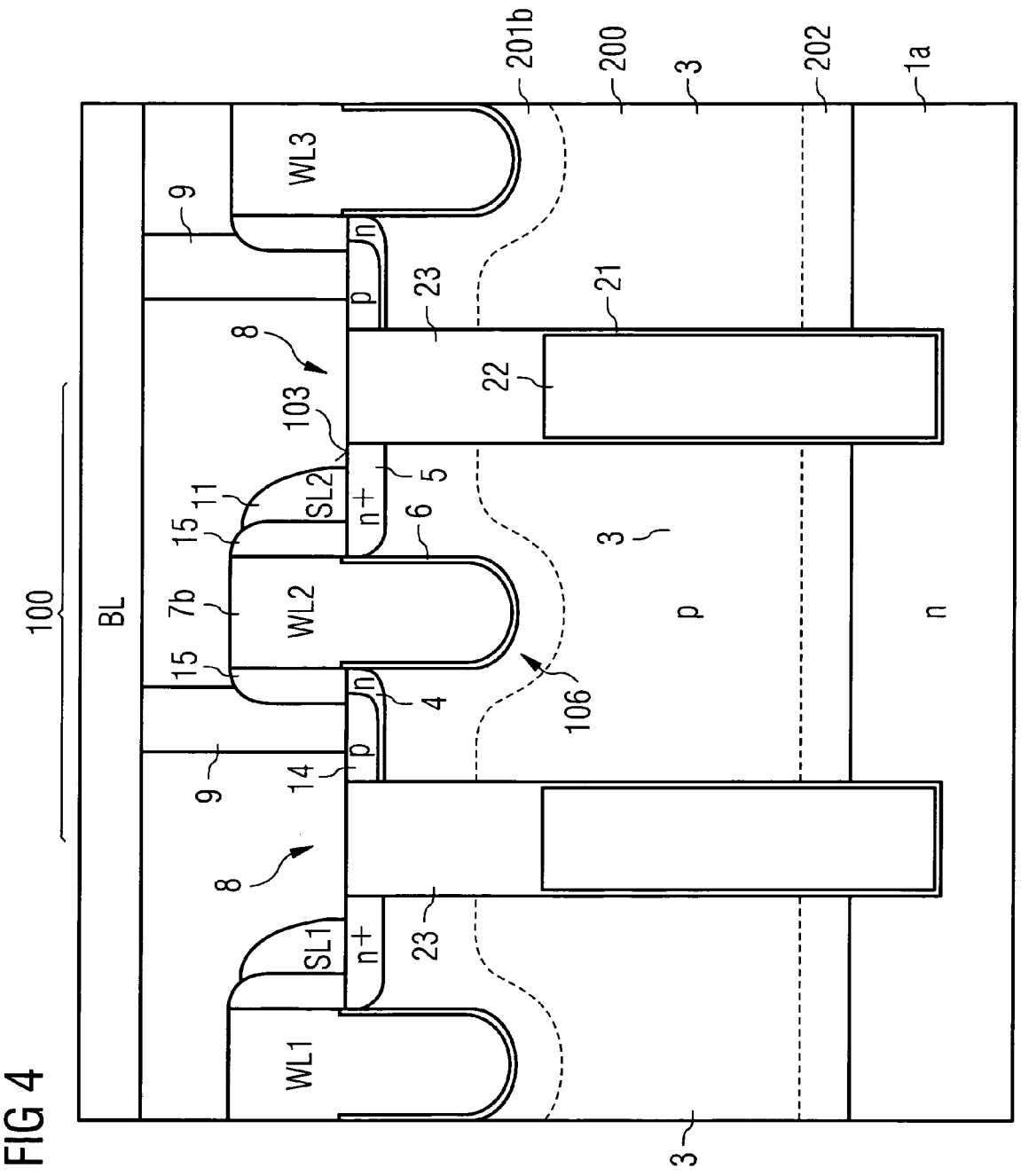

In FIG. 4, a second embodiment of a memory cell 100 is illustrated. A recess 106 may be formed into the first surface of the transistor body 3 between the drain area 4 and the source area 5. The gate dielectric layer 6 is provided on the surface in the recess 106, and the gate electrode 7b extends into the recess 106. Thus, a longer channel is provided guided along the outer surface of this recess.

A first advantage results in the fact that a longer channel reduces leakage currents from the drain area 4 to the source area 5 when the transistor is switched off. Thus the power consumption of the memory device is significantly reduced.

A further advantage results in the fact that charges which are stored far from the source and drain areas 4, 5 are still influencing the channel because it extends deep into the transistor body 3. Thus, the injected charges may be injected into areas distant to the source and drain areas. Similar to the first embodiment, a dopant concentration of a dopant is high in a first region 200 in the bulk of the transistor body 3 and is low in a second 201b close to the source area 5 and the drain area 4 and in a third area 202 close to the semiconductor substrate 1a.

Figure 5:
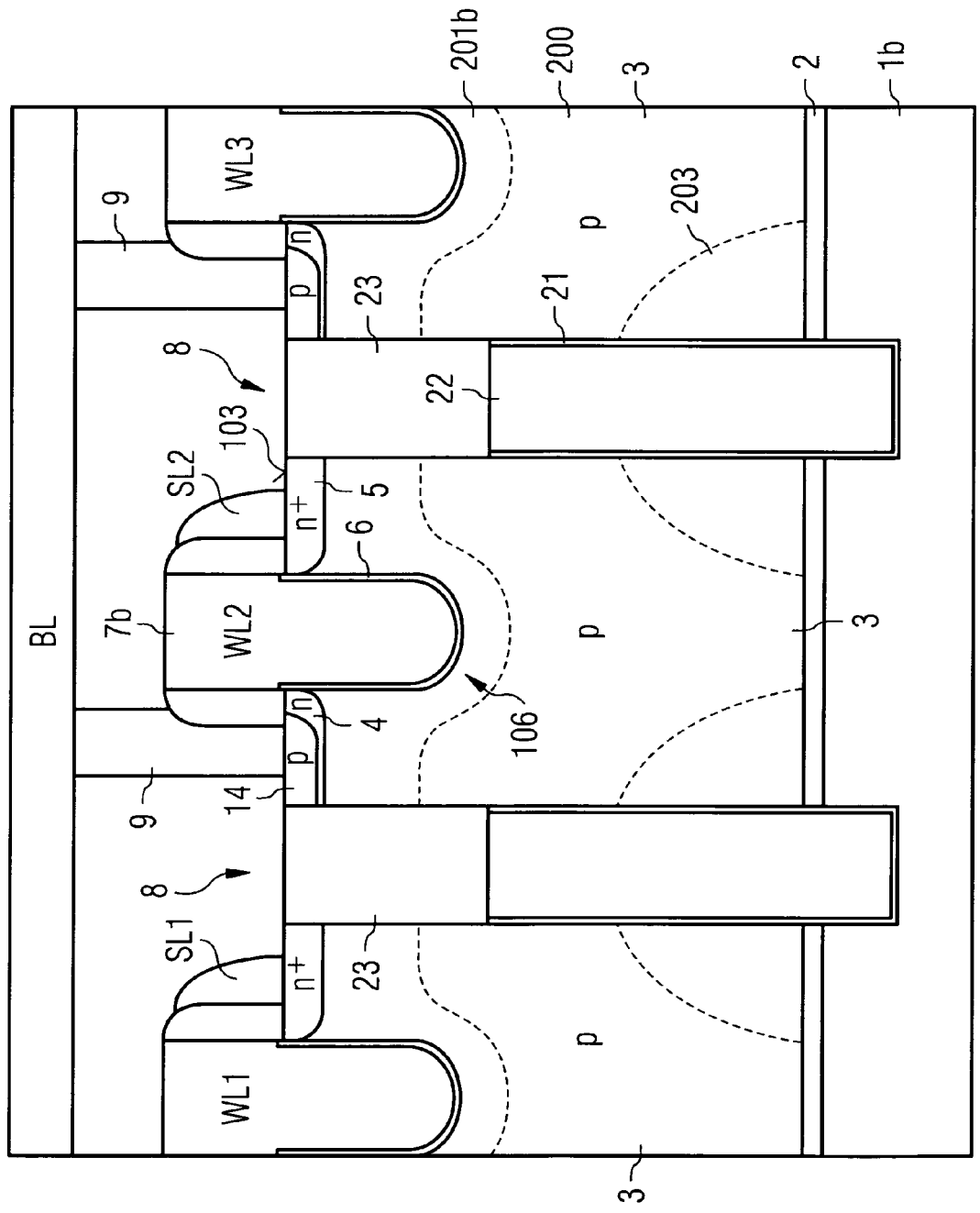

In a further preferred embodiment (FIG. 5), the semiconductor substrate 1b is isolated from the transistor body 3 by an isolation layer 2. In this case, a dopant concentration in areas 203 close to the semiconductor substrate 1b may be high. Thus, the specific capacitance of the capacitor unit in these areas is high and most of the injected charges are localized in the areas 203. Advantageously, these areas are the most distant places to the drain and source areas 4, 5. Thus, a leakage of the injected charges may be reduced to a minimum. Further, it is favorable to reduce a dopant concentration along a vertical line below the gate electrode 7b.

By this way, a leakage of the stored charge into the channel during read out is reduced.

Adjacent to sidewalls of the gate electrode 7b and the word line WL, spacers 15 made of an oxide or nitride may be arranged. Additionally, a conductive spacer may form the source line SL instead of a source line contact 11. This conductive spacer is in contact with the source area 5 and formed adjacent to an isolating spacer 15.

Although the present invention has been described along with preferred embodiments, the present invention is not limited thereon.

In particular, the dopants may be exchanged to dopants having the opposite conductivity type. In this case the voltages applied for the operation have to be inverted.

What is claimed is:

1. An integrated circuit including a semiconductor memory device comprising a plurality of memory cells, wherein each memory cell comprises a respective transistor, said transistor comprises:
    a transistor body of a first conductivity type, wherein the transistor body is electrically isolated from transistor bodies of neighboring memory cells;
    a drain area and a source area each having a second conductivity type, said drain area and source area are embedded in the transistor body on a first surface of said transistor body;
    a gate structure having a gate dielectric layer and a gate electrode, wherein said gate structure is arranged between said drain area and said source area;
    an emitter area of said first conductivity type, wherein said emitter area is operably associated with said drain area; and
    at least one bit line and at least one source line, wherein said source area is connected to said source line, and said emitter area is connected directly to said bit line through a bit line contact.

2. The integrated circuit according to claim 1, further comprising a semiconductor substrate of said second conductivity type, wherein said transistor body is arranged adjacent to said semiconductor substrate.

3. The integrated circuit according to claim 1, wherein said transistor body comprises a first region and a second region, wherein said second region is arranged near said first surface and said first region is arranged in a bulk area of the transistor body under and adjacent to said second region, wherein a doping concentration of dopants of said first conductivity type is higher in said first region than in said second region.

4. The integrated circuit according to claim 1, wherein said emitter area is distanced from said gate electrode by said gate dielectric layer.

5. The integrated circuit according to claim 1, wherein the emitter area is adjacent to the drain area.

6. The integrated circuit according to claim 1, further comprising a recess formed in said first surface between said drain area and said source area, wherein said gate dielectric layer and said gate electrode are at least partially arranged in said recess.

7. The integrated circuit according to claim 6, wherein a vertical extension of said recess is larger than a vertical extension of said drain area and/or said source area.

8. The integrated circuit according to claim 1, further comprising an underlying semiconductor substrate and an isolation layer wherein said transistor body is isolated from said underlying semiconductor substrate by said isolation layer.

9. The integrated circuit according to claim 8, wherein the transistor body further comprises a third region and a vertical border, wherein said third region is arranged adjacent to both said semiconductor substrate and said vertical border, and wherein a doping concentration of a dopant of said first conductivity type is higher in said third region than in said bulk area of the transistor body.

10. The integrated circuit according to claim 1, further comprising at least one word line, wherein said gate electrode is connected to said word line, and said drain area is connected to said bit line.

11. The integrated circuit according to claim 10, wherein said source line is formed as a spacer, and wherein said spacer is arranged adjacent to said gate electrode.

12. The integrated circuit according to claim 1, further comprising an isolation trench arranged adjacent to and surrounding one or more sidewalls of said transistor body.

13. The integrated circuit according to claim 12, further comprising a conductive material and a dielectric layer at least partially filling said isolation trench, wherein said dielectric layer is arranged on sidewalls of said isolation trench for isolating said transistor body from said conductive material.

14. The integrated circuit according to claim 13, wherein the conductive material forms a first common electrode of said plurality of memory cells.

15. An integrated circuit formed on a substrate, comprising:
    a source region having a first conductivity type;
    a drain region having the first conductivity type;
    a body region having a second conductivity type opposite to the first conductivity type, the body region extending to a first depth below the substrate surface, the body region comprising a channel region extending between the source region and drain region;
    a gate electrode adjacent to the channel region, and a gate dielectric disposed between the gate electrode and the channel region;
    an emitter region having the second conductivity type arranged adjacent to or embedded in the drain region, the emitter region separated from the body region by the drain region;
    an isolation region directly under the body region; and
    an isolation trench comprising a dielectric material, the isolation trench laterally surrounding the body region and extending downward to a second depth below the substrate surface, wherein the second depth is larger than the first depth.

16. The semiconductor device of claim 15, wherein the isolation region comprises a semiconductor layer having the first conductivity type such that a pn junction electrically isolates the body region from the substrate.

17. The semiconductor device of claim 15, wherein the isolation region comprises an isolation layer that electrically isolates the body region from the substrate.

18. The semiconductor device of claim 15, wherein the isolation trench further comprises a conductive material, and wherein the dielectric material is disposed between the conductive material and the body region.

19. The semiconductor device of claim 15, wherein the channel region is non-linear.

20. The semiconductor device of claim 15, wherein the gate electrode is electrically connected to a word line, the source region is electrically connected to a source line running parallel to the word line, and the emitter region is electrically connected directly to a bit line running transverse to the word line.

21. The semiconductor device of claim 15, wherein the transistor forms part of a memory cell for storing information represented by a charge, wherein the charge is stored in the body region.

22. The semiconductor device of claim 21, wherein the transistor is configured to adopt one of at least two states distinguishable by corresponding threshold voltages depending on the charge in the body region.

23. An integrated circuit including a semiconductor memory device comprising a plurality of memory cells, wherein each memory cell comprises a respective transistor, said transistor comprises:

a transistor body of a first conductivity type, wherein the transistor body is electrically isolated from transistor bodies of neighboring memory cells;

a drain area and a source area each having a second conductivity type, said drain area and source area are embedded in the transistor body on a first horizontal surface of said transistor body;

a gate structure having a gate dielectric layer and a gate electrode, wherein said gate structure is arranged between said drain area and said source area;

an emitter area of said first conductivity type, wherein said emitter area is operably associated with said drain area; and at least one bit line and at least one source line, wherein said source area is connected to said source line, and said emitter area is connected directly to said bit line through a bit line contact.

* * * * *